United States Patent [19]

Köhler et al.

[11] 4,390,770
[45] Jun. 28, 1983

[54] AUTOMATIC WELDING APPARATUS FOR SOLAR CELLS

[75] Inventors: Franz Köhler, Unterhaching; Albert Meggl, Munich, both of Fed. Rep. of Germany

[73] Assignee: Messerschmitt-Bölkow-Blohm Gessellschaft mit beschränkter Haftung, Munich, Fed. Rep. of Germany

[21] Appl. No.: 286,390

[22] Filed: Jul. 24, 1981

Related U.S. Application Data

[63] Continuation of Ser. No. 65,444, Aug. 10, 1979, abandoned.

[30] Foreign Application Priority Data

Sep. 23, 1978 [DE] Fed. Rep. of Germany ........ 2841465

[51] Int. Cl.$^3$ .............................................. B23K 11/10
[52] U.S. Cl. .................... 219/56.21; 219/80; 219/85 F; 219/86.7; 219/91.1
[58] Field of Search ..................... 219/56.21, 56.22, 79, 219/80, 85 F, 86.7, 87, 91.1, 86.25

[56] References Cited

U.S. PATENT DOCUMENTS

| | | | |
|---|---|---|---|
| 3,430,028 | 2/1969 | Goforth et al. | 219/87 |
| 3,544,754 | 12/1970 | Buttke et al. | 219/79 |
| 3,695,501 | 10/1972 | Radobenko | 219/56.21 X |
| 3,696,985 | 10/1972 | Herring et al. | 219/56.21 X |
| 3,708,648 | 1/1973 | Croucher et al. | 219/91.1 X |
| 3,774,006 | 11/1973 | Pasquire et al. | 219/91.1 X |
| 4,041,271 | 8/1977 | Lorans | 219/86.25 |
| 4,121,084 | 10/1978 | Wear | 219/91.1 X |

FOREIGN PATENT DOCUMENTS 2717453 10/1978 Fed. Rep. of Germany ... 219/86.25

Primary Examiner—B. A. Reynolds
Assistant Examiner—Philip H. Leung
Attorney, Agent, or Firm—Toren, McGeady and Stanger

[57] ABSTRACT

Automatic welding apparatus is provided for welding contact tabs to solar cells which are particularly adapted for use in space vehicular solar generators. The apparatus comprises a plurality of welding electrodes arranged to extend across the direction of movement of a solar cell conveying table. The electrodes are movable in two directions perpendicular to each other and both perpendicular to the direction of movement of the conveying table. Furthermore, the apparatus is provided with the capacity for controlling the conveying table to effect automatic positioning of welding points on the solar cells beneath the welding electrodes, high-power current supply for enabling control of the welding current applied to the electrode heads, a protective gas line for feeding each of the electrode heads, an ohmmeter for monitoring the effective contact resistance of each of the welding points, a device for enabling individual visual inspection of the welds produced by each of the electrode heads, and a program control for monitoring the operational parameters of the apparatus, including the number of welds produced, the welding period, the voltage and current, and other parameters whereby the operation of the apparatus may be appropriately managed.

8 Claims, 4 Drawing Figures

AUTOMATIC WELDING APPARATUS FOR SOLAR CELLS

This is a continuation of application Ser. No. 065,444, filed Aug. 10, 1979, now abandoned.

BACKGROUND OF THE INVENTION

The present invention relates generally to automatic welding apparatus and more particularly to welding apparatus for welding contact tabs to solar cells. The welding apparatus of the invention is specifically intended for use with solar cells which are utilized in space vehicular solar generators. The apparatus is provided with a plurality of welding electrodes positioned at intervals relative to each other and also positioned relative to a conveying table upon which the solar cells are moved past a welding station at which the welding electrodes are located.

Semiconductor solar cells individually supply voltages which are rather low and usually well below one volt. Accordingly, in an apparatus utilizing such cells, numerous solar units are arranged in series connection as a function of target terminal voltage.

Cells of this type normally measure only a few centimeters taken in the edgewise direction and accordingly they are in electrical conducting interconnection.

Based upon extremely high operational loads and the requirements of functional reliability for solar cells such as those used in space vehicular solar generators, solar cells of this type must be particularly fail safe in their design and structure. More specifically, the junctions of single solar cells where contact tabs consisting of silver are welded onto silver-evaporated back surfaces, there must be provided the utmost dependability since if an error function develops in a single cell it can result in failure or malfunction of an entire series of cells which will produce serious energy problems in space vehicular missions.

Welding is considered to be the preferred method for joining contacts to the solar tabs and it has developed that welding is now preferred to other attachment processes.

Furthermore, in view of the sensitive state of the cells, a key factor favoring utilization of welding as the attachment process relates to the quality of the attachments or connections which are made in that a precise control of parameters such as current, voltage, resistance, welding time, electrode pressure and air gap distance, among others, is possible.

A known example of welding units of the type involved wherein the equipment is provided with an air gap electrode unit is described in UNILAB Welding Report No. 12-203 entitled "Excerpt from a Lecture by H. Zschimmer" dated Sept. 27, 1973 given at the International Electronics Center in Munich, Germany.

A drawback of welding units of this type is that they require considerable manual labor. Each welding point must be positioned beneath the electrode by a manual operation which requires, for example, in the case of a satellite equipped with six solar cell panels an alignment of 18,000 cells with 10 to 20 welding points.

The monitoring of single welding units is equally complex inasmuch as individual tests will consume more time even with logging omitted and consequently an incomplete final inspection.

Accordingly, it is an object of the invention to produce an automatic welding apparatus which, for the purpose involved, will operate in a fully automatic, monitored and reproducible manner with the apparatus operating to meet design quality standards and the exigencies of space flight technology.

SUMMARY OF THE INVENTION

Briefly, the present invention may be described as automatic welding apparatus for welding contact tabs to solar cells which are particularly suitable for use in space vehicular solar generators, the apparatus comprising a plurality of welding electrodes including electrode heads having individually controlled contact pressure means which are arranged to extend across a solar cell conveying or pick-up table which is movable in a given direction for moving the solar cells through a welding station past the welding electrodes, the electrode heads being programmed to move in two directions which are perpendicular relative to each other and which are both perpendicular to the direction of movement of the conveying table. The apparatus of the invention further comprises means for controlling the conveying table to effect automatic positioning of the welding points on the solar cells beneath the welding electrodes, high-powered current supply means for enabling control of welding current applied to the electrode heads, a protective gas line for feeding each of the electrode heads, an ohmmeter for monotoring the effective resistance at the welding points, a device for allowing visual monotoring of each weld for each electrode, and program control means for monitoring all of the operational parameters of the apparatus such as the number of welds produced, the welding period, the voltage, the current and other similar parameters whereby operational functions of the apparatus such as switch-offs or breakdowns can be managed.

Advantages to be obtained by the present invention involve a significantly increased welding capacity rated at an optimally obtainable welding quality. Thus, costs for the manufacture of expensive solar cell generators may be partially reduced to a considerable amount inasmuch as time consuming manual welding requiring intensified manpower with the natural drawbacks accompanying such a technique is replaced by an automatic, continuous and completely monitored welding operation in a feasible manner.

The various features of novelty which characterize the invention are pointed out with particularity in the claims annexed to and forming a part of this disclosure. For a better understanding of the invention, its operating advantages and specifie objects attained by its use, reference should be had to the accompanying drawings and descriptive matter in which there is illustrated and described a preferred embodiment of the invention.

DETAILED DESCRIPTION OF THE PREFERRED EMBODIMENT

Figure 1:
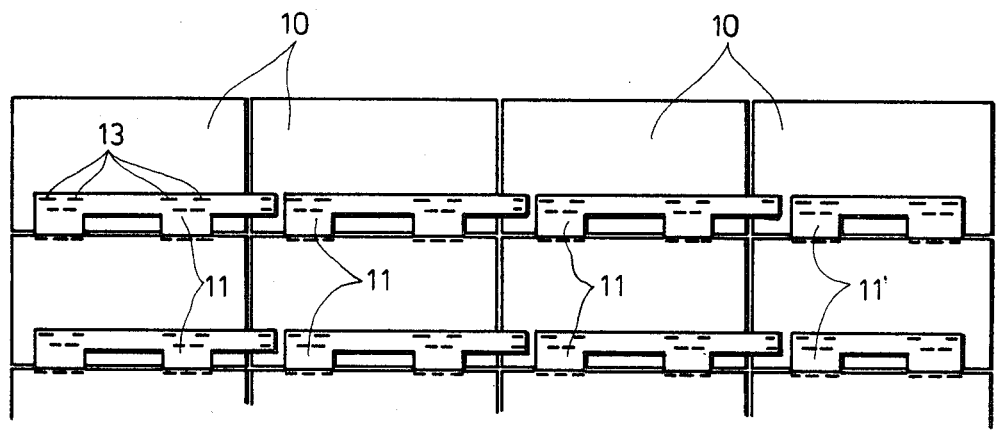
FIG. 1 is a plan view showing a solar cell panel cutout with welding point positions indicated.

Referring now to FIG. 1, there is shown a plurality of solar cells 10 arranged adjacent and below each other in a modular pattern. The single cells are semiconductors of conventional design which have evaporated silver on the back sides thereof. Contact tabs 11, 11' which are also composed of silver and which are shaped to facilitate utilization thereof with the solar cells, as shown, are arranged in a manner whereby a series or parallel switching set-up may be produced by a simple geometric arrangement.

Welding spots 13 are located on each cell with the location of the welding spots 13 being identical for each of the cells. Of course, it should be understood that other welding patterns need not be excluded and other welding spots may be located for example for repair operations, by manual means or by program control means. From FIG. 1 it will be apparent that a plurality of welding spots for each of the contact tabs is required in order to produce adequate contact capacity for the solar cells and adequate wear and other standards.

Figure 2:
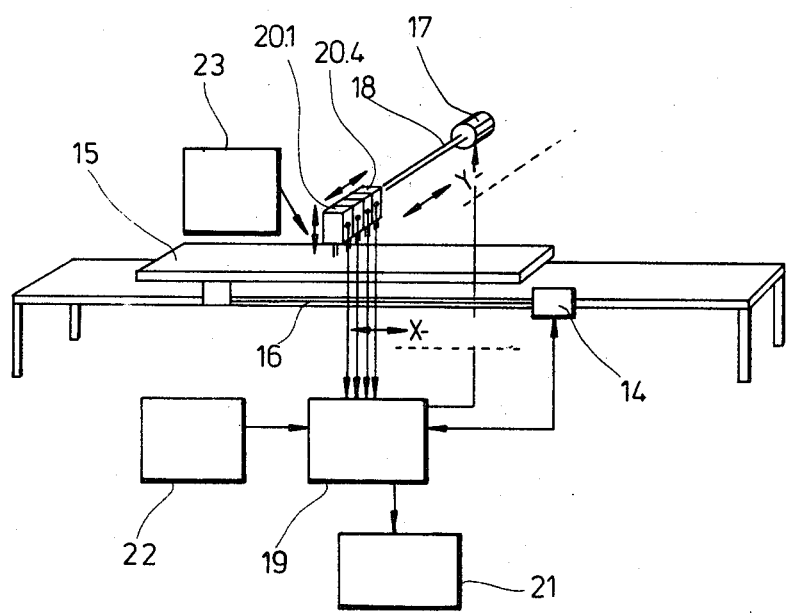
FIG. 2 is a schematic perspective view of an automatic welding apparatus in accordance with the invention.

During space flight operational conditions, the module will be exposed to extreme loads so that the quality of each individual weld must be insured before ultimate utilization of the device. The automatic welding apparatus shown schematically in FIG. 2 is designed to meet the requirements of such conditions and as shown the apparatus comprises a solar cell pick up or conveying table 15 which is movable in an X-direction by means of a spindle 16 which is equipped with a stopper motor 14. The table 15 supports a backing strip with solar cells fixed in position.

Above the table 15 there are located four electrodes, the first and the last of said electrodes being identified by the reference numerals 20.1 and 20.4. The electrodes are also movable in a Y-direction which extends horizontally across and perpendicular to the X-direction of movement of the table 15 and in a generally vertical direction which is perpendicular to both the X and Y directions. The electrode heads 20.1–20.4 are movable in the Y direction by means of a stepped motor 17 and a spindle 18 with height adjustment or vertical movement thereof being effected by pneumatic actuation. Each electrode head 20.1–20.4 may be individually controlled and lowered onto a welding spot under a preset pressure whereby all of the movements involved in the overall process may be controlled in accordance with a preset program by means of a program control 19. In addition to this function, the program control 19 will also manage the control and monotoring of all other processes including welding current supply, the nature of the welding, the material to be welded and other items of this nature. All monitored parameters and processes will be stored in a register 21 for remonitoring purposes, for example the ordinary approach being to utilize magnetic tape.

Moreover, the installation may be switched from automatic to manual operation by a manual operation switching device 22 when, for example, it is necessary to execute repair operations. For both operating modes, automatic and manual, a visual type of monitoring is provided by means of equipment such as television apparatus, or stereomicroscopes. Manual control is utilized also for positioning the initial welding point beneath the associated electrode. For this purpose, a sighting device which may, for example, utilize cross-hairs, is provided. After the initial setting, further welding may proceed automatically.

The apparatus will stop automatically and emit an appropriate signal each time that an operation occurs which deviates or exceeds the parameters established by the program control means 19 which is preset with the required tolerances or extreme values. Failure to maintain operating parameters within required limits may include such deviations as incorrect electrode contact pressure, errors made in the protective gas supply an overly high or overly low contact resistance, deviations from tolerable electrode temperatures, and similar operational characteristics. Following the servicing of any breakdown or operating deviation involved, the machine will automatically continue with the welding process in accordance with the program provided. Further provision is made so that, for example, after 160 welding points have been accomplished an automatic break is established so that preventive maintenance may be accomplished.

The electrodes which are utilized are preferably air gap electrodes which may easily be replaced by electrodes in inventory. The current lead-in electrode is composed of copper and is applied to the welding point at a lower pressure rate than is the tungsten-composed electrode, with welding resistance determining the second electrode. In this case, according to the cited state of the art, the heat at the electrode tip will develop at a precise rate. Monitoring is accomplished by heat sensors which may, for example, be infrared sensors, with their output being equally allocated to the program control 19. Also, other suitable temperature detectors can be utilized. The illumination provided for visual monitoring is preferably by cold light which will not interfere with testing.

Not shown in detail in FIGS. 1 and 2 are design elements which are known per se in the welding technology such as high powered current supply, protective gas lines, and ohmmeters. In this case, commercially available units which are well known to those skilled in the art may be utilized.

Figure 3:
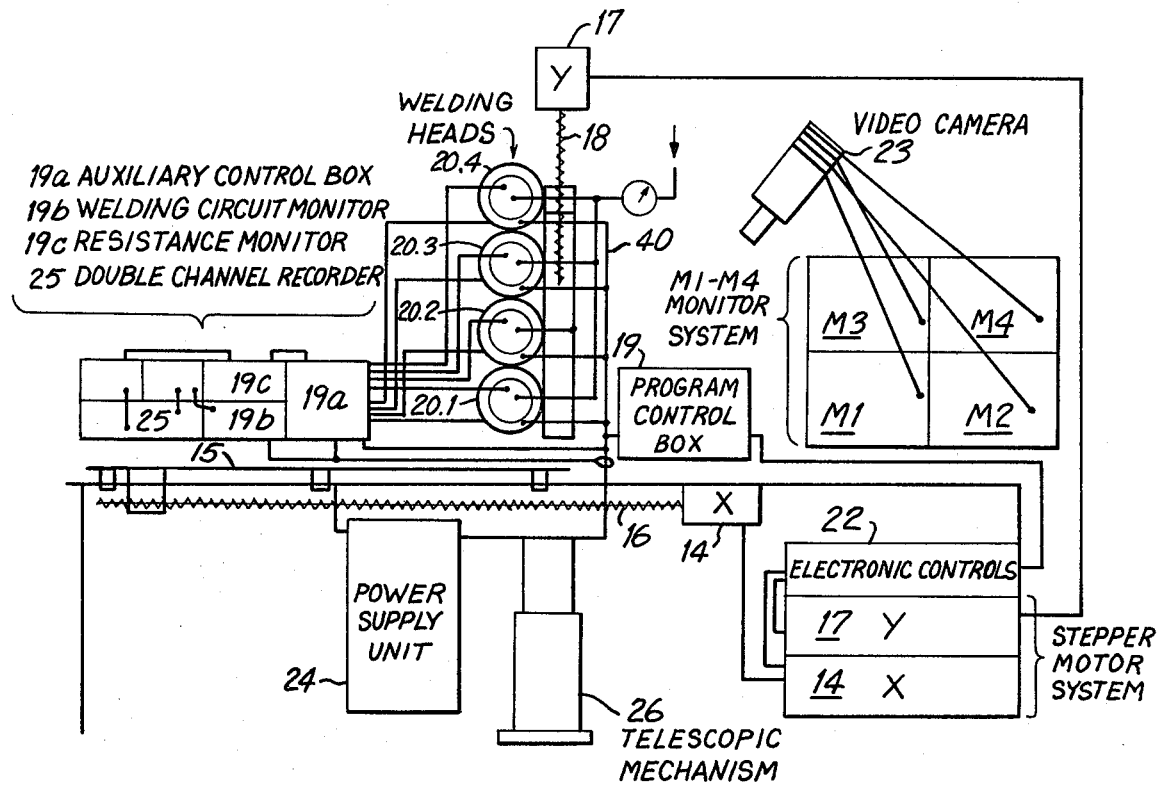
FIGS. 3 and 4 are schematic representations of systems in accordance with the present invention.

FIG. 3 depicts schematically a system which serves for the controlled in-line production of well established module types. The system involves a fixed program with no adaptation to any deviating types. The system consists of a controlled stepper motor system 14 with a spindle 16 for moving the welding table 15 in the x direction. Four welding head 20.1 to 20.4 are arranged over the welding table with a distance head-to-head identical to the cell length plus the cell gap width. These heads are commonly movable in the y direction by a further controlled stepper motor system 17 and a spindle 18. For installation of the electrodes, the entire head rod may be lifted pneumatically by a conventional telescopic mechanism 26 not part of the invention. Lowering the heads to the cells for welding is initiated by a further pneumatic or air pressure system 40 which includes gas line means 40a shown in FIG. 4. Each electrode head is separately adjustable and operable according to a fixed program electrically wired within the program control box 19. An auxiliary control box 19a which is conventional and not part of the invention initiates the welding pulse at the power supply unit 24 and controls the electrode resistance and the welding current. The system depicted in FIG. 3 includes a welding current monitor 19b and a resistance monitor 19c. The welding parameters of voltage V and current I are documented on a double channel recorder. Visual supervision of the welding process by an operator is enabled with the aid of a video camera 23 and a conventional monitor system M1–M4 (black and white). The system includes electronic controls 22 for manual operation and a power supply unit 24. Also, a conventional double channel recorder 25, not part of the invention, is provided.

In FIG. 3 the welding heads 20.1–20.4 and drive 17 are shown as viewed vertically from above and the remainder of the apparatus is shown from a horizontal viewpoint, for clarity.

Figure 4:
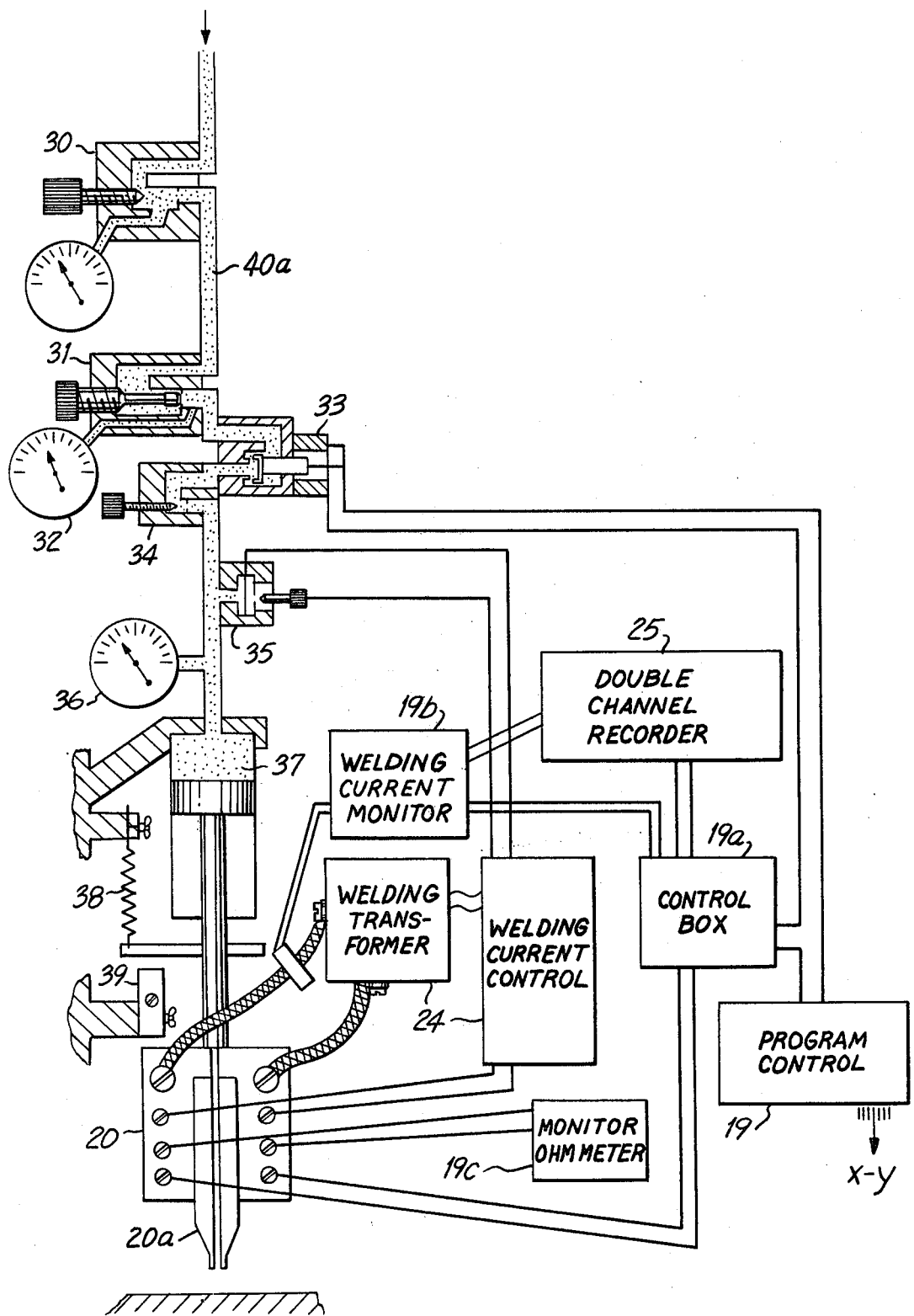

In FIG. 4 there is shown a system for operation of the welding heads. The system includes a program control 19 and an auxiliary control box 19a with a welding and current control 19b and a resistance monitor 19c being provided. The welding head 20, which includes conventional interchangeable electrodes 20a, receives power from the welding current supply 24 and the welding current-voltage recorder 25 which is included in the system. A pressure reducer mechanism 30 and 31 with a pressure gauge 32 is provided adjacent the inlet of a compressed air line indicated by the arrow at the top in FIG. 4. A solenoid valve 33 and a throttle check valve 34 are included in the system together with a pressure switch 35 and a cylinder pressure gauge 36. The system includes a pressure cylinder 37 and a piston return spring 38. An adjustable brake 39 operates for setting of the electrodes. The elements 30–36, 38, and 39 are all conventional and are not part of the claimed invention.

While a specific embodiment of the invention has been shown and described in detail to illustrate the application of the inventive principles, it will be understood that the invention may be embodied otherwise without departing from such principles.

What is claimed is:

1. Automatic welding apparatus for welding contact tabs to solar cells which are particularly adapted for use in space vehicular solar generators comprising:

a plurality of welding electrodes including electrode heads having individually controlled contact pressure means;

a solar cell conveying table movable in a given direction for moving solar cells through a welding station past said welding electrodes;

said electrode heads being arranged to extend across said conveying table;

means for moving said electrode heads in a first and a second direction perpendicular to each other, said first and second directions both being perpendicular to said given direction of movement of said conveying table;

means for controlling said conveying table to effect automatic positioning of welding points on said solar cells beneath said welding electrodes;

high-powered current supply means for enabling control of welding current supplied to said electrode heads;

protective gas line means feeding each of said electrode heads;

ohmmeter means for monitoring the effective contact resistance at each of said welding points;

means for enabling individual visual inspection of welds produced by each of said electrode heads; and program control means for monitoring operational parameters of said apparatus for effecting management of operational functions thereof.

2. Apparatus according to claim 1 wherein said electrode heads are equipped with air-gap electrodes each of which comprise a copper electrode and a high impedence tungsten electrode.

3. Apparatus according to claim 1 wherein said electrode heads are individually interchangeable.

4. Apparatus according to claim 1 wherein said visual inspection means comprise television equipment.

5. Apparatus according to claims 1 or 4 further including means for recording observations made as a result of said visual inspection means.

6. Apparatus according to claim 1 further comprising a register including identifier means for storing all monitored parameters of said apparatus including consequent reactions.

7. Apparatus according to claim 6 further including stepped motor means including a spindle for driving said solar cell conveying table.

8. Apparatus according to claim 7 further comprising spring-loaded pneumatic means for effecting vertical movement of said welding electrodes and a stepped motor including a spindle for effecting horizontal movement of said welding electrodes, said vertical and horizontal movements consisting of movement of said electrode heads in said first and said second directions.

* * * * *